United States Patent [19]
Kuroda

[11] 4,076,860
[45] Feb. 28, 1978

[54] METHOD OF FORMING ELECTRODE WIRINGS IN SEMICONDUCTOR DEVICES

[75] Inventor: Hiroshi Kuroda, Katano, Japan

[73] Assignee: Matsushita Electric Industrial Co., Ltd., Kadoma, Japan

[21] Appl. No.: 715,643

[22] Filed: Aug. 18, 1976

[30] Foreign Application Priority Data

Aug. 20, 1975 Japan .................................. 50-101336

[51] Int. Cl.² .......................... B05D 1/32; B05D 5/12; C23C 13/02
[52] U.S. Cl. ........................................ 427/91; 427/99; 427/250; 427/259; 156/656; 156/661
[58] Field of Search ...................... 427/99, 91, 259, 96, 427/250, 82; 156/11, 18, 3; 204/192 E, 192 EC

[56] References Cited

U.S. PATENT DOCUMENTS

| | | | |
|---|---|---|---|
| 2,989,385 | 6/1961 | Gianola | 156/18 |
| 3,115,423 | 12/1963 | Ashworth | 156/11 |
| 3,725,743 | 4/1973 | Murayama | 427/96 |
| 3,794,536 | 2/1974 | Muska | 156/11 |
| 3,957,552 | 5/1966 | Ahn | 156/11 |

Primary Examiner—Ralph S. Kendall
Assistant Examiner—R. Eugene Varndell, Jr.
Attorney, Agent, or Firm—Wenderoth, Lind & Ponack

[57] ABSTRACT

A method of forming electrode wirings for semiconductors devices. A first photoresist pattern is formed on the surface to be provided with electrode wirings in the configuration of an inverse pattern to the electrode wirings, and on the top of this pattern-containing surface is vapor deposited, a conductor of electrode material. On the conductor layer, a second photoresist layer is applied. This photoresist layer is etched until only the upper surface of the part of the conductor layer located above the first photoresist pattern, is exposed, thereby forming a second photoresist pattern. Then, by etching the aforementioned conductor layer with this second photoresist patterns as the etching mask, only the part of the conductor layer which is not to constitute the electrode wirings is removed. By this method, thicker electrode wirings than those formed by the conventional lift-off method may readily be formed.

6 Claims, 15 Drawing Figures

METHOD OF FORMING ELECTRODE WIRINGS IN SEMICONDUCTOR DEVICES

BACKGROUND OF THE INVENTION

The present invention relates to a method of forming the electrode wirings in semiconductor devices. By "electrode wirings" is meant interconnections between semi-conductor devices and electrodes for connection of leads to semiconductor devices. The method of the invention pertains in particular to an improvement of the so-called lift-off method.

The so-called lift-off method of forming the electrode wirings in a fine pattern such as that in highly integrated IC circuits, as shown in FIG. 1, is well known. Referring to FIG. 1, 1 denotes a substrate of silicon, on which a silicon oxide film 2 (hereinafter referred to as a SiO$_2$ film) is formed.

On top of this film, the electrode wiring is formed by the following process. First, as shown in FIG. 1(a), a photoresist 3 is applied to the SiO$_2$ film and then, with a photomask 4 closely fitted thereover, an exposure to ultraviolet ray 5 is carried out. Then, the exposed part of the photoresist is removed with a solvent (FIG. 1(b)). On the surface having the photoresist pattern 3a formed as a mask thereon in this way, a vapor-deposition of Al is carried out, to form an Al film 7 covering both the photoresist pattern 3a and the exposed part 6 of the SiO$_2$ film 2 (FIG. 1(c)). This Al film 7 is thinner than the photoresist pattern 3a, e.g. is less than one-third the thickness thereof. Following this, the photoresist pattern 3a is removed by the use of a photoresist stripping solution. This process is possible because the Al film has a stepped part 8 which is very thin at the boundries between the photoresist pattern 3a and the exposed part 6 of the SiO$_2$ film. By this process, the Al film 7 is cut off at the stepped part 8, and at the same time, the part of the Al film 7 on the photoresist pattern 3a is removed, and as a result, the electrode wiring is formed by the portions of the Al film pattern 7a left on the SiO$_2$ film 2.

Since the thin part of the Al film 7 at the stepped part 8 must be provided in order to carry out this method, it is not practical to vapor-deposit the Al film 7 so that it has a great thickness. Thus, the electrode wiring formed by this method is susceptible to wire-breakage which is a hindrance to the improvement in the yield in the production of integrated circuits.

BRIEF SUMMARY OF THE INVENTION

The object of this invention is to provide a method of forming electrode wirings which makes it possible to produce fine electrode wirings having a desired thickness and so that improved yields in the production of integrated circuits can be achieved.

With a view to attaining this object, the method of this invention provides an improvement in the process of removing the unnecessary part of the conductor film in the conventional lift-off method described above. In this improved method there is applied: On the conductor film formed in the same manner as in the lift-off method, a second photoresist layer, and the surface of the second photoresist layer is etched so as to expose the upper surface of part of the conductor film on the first photoresist pattern by taking advantage of the location of part of the conductor film in one area of pattern at a higher level on than the part in the other area. Then, with the second photoresist pattern formed thereby as the etching mask, the conductor layer is etched to remove only the unnecessary part.

DETAILED DESCRIPTION OF THE PREFERRED EMBODIMENT

Figure 1A:
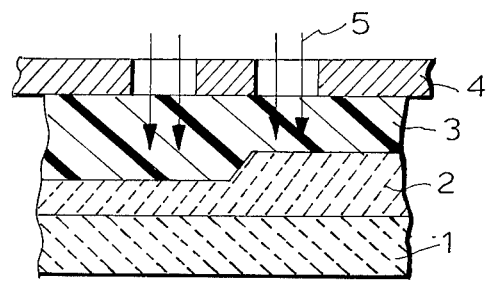
FIGS. 1(a) to 1(d), are sectional views for explaining the steps of the conventional lift-off method of forming the electrodes.
Figure 1B:
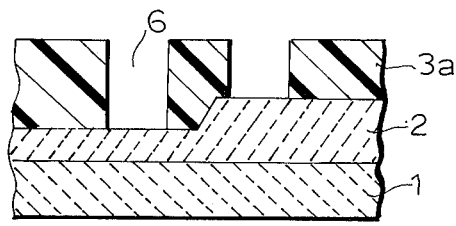
Figure 1C:
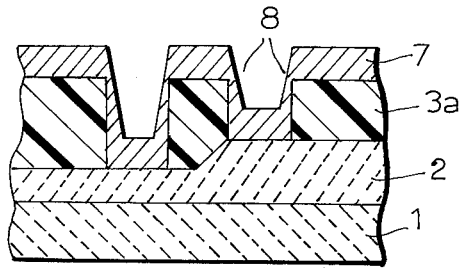
Figure 1D:
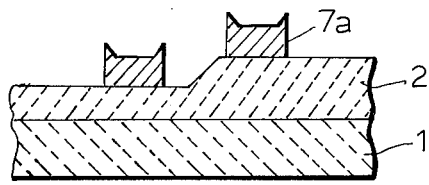
Figure 2A:
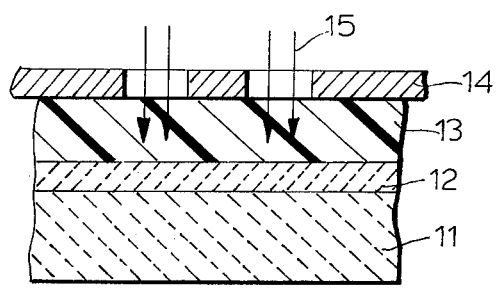
FIGS. 2(a) to 2(g) are sectional views showing the steps of forming the electrode wirings according to this invention.

Referring to FIG. 2(a), 11 denotes the Si substrate, on which the SiO$_2$ film 12 is formed. First, a photoresist layer 13 is applied over the SiO$_2$ film 12. For this photoresist layer 13, either a positive type or a negative type of photoresist material can be utilized. In this instance, a positive type, e.g., AZ 1350J(brand), is used, and the film thickness is 2 microns. This photoresist layer 13 is covered with a photomask 14 and is then, exposed to ultraviolet rays 15.

Figure 2B:
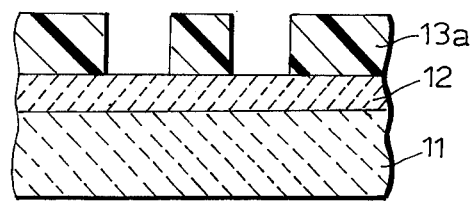

Then, the exposed part of the photoresist layer 13 is removed with a solvent, thereby forming the first photoresist pattern 13a as shown in FIG. 2b. This pattern 13a must be the inverse pattern to the required electrode wirings. If light sensitive resin of the positive type is employed, it is very easy to form such a pattern in which the parts of the pattern have a width of several microns.

Figure 2C:
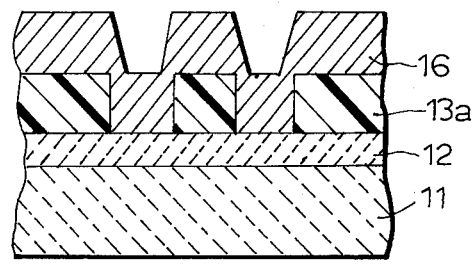

Then, vapor deposition of Al is performed. An Al film with a thickness of 1 - 2 microns is formed on the photoresist pattern 13a and the exposed part of the SiO$_2$ film, i.e. the part which is not masked by the photoresist pattern 13a, as shown in FIG. 2(c).

Figure 2D:
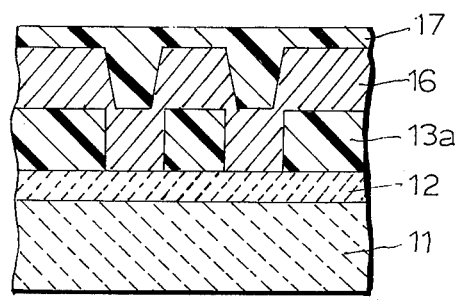

Then, on this Al film 16, a further photoresist layer 17 is applied, as shown in FIG. 2(d). It is desirable for the benefit of the next succeeding step to make the surface of this photoresist layer 17 flat and smooth regardless of the irregularities in the surface of the Al film 16. Accordingly, a positive type resist (e.g., AZ 1350J) is preferable, but a negative type can also be used.

Figure 2E:
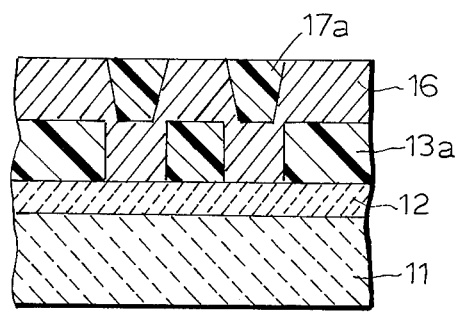

Then, the entire surface of the photoresist layer 17 is etched by oxygen plasma, thereby removing the surface layer of the photoresist 17 until the surface of the parts of the Al film 16 on the aforementioned first photoresist pattern 13a are exposed (FIG. 2(e)). In this way, a second photoresist pattern 17a which exactly covers the open parts of the first photoresist pattern 13a is formed. The preferred conditions for the oxygen plasma etching are, for example, 50 W, 0.45 Torrs and 0.1 $\mu$m/min.

Figure 2F:
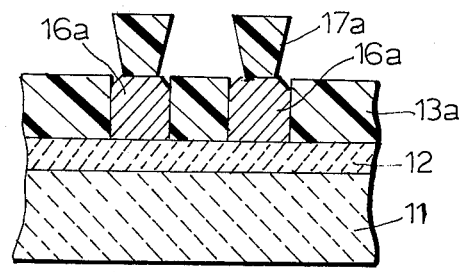
Figure 2G:
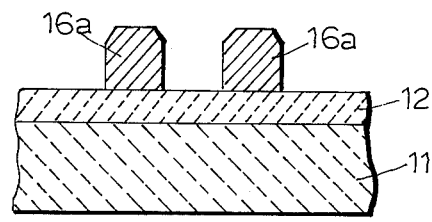

Then, with the second photoresist pattern 17a as the etching mask, the Al film 16 is etched off by a phosphoric acid base etching solution. The etching is carried out until the upper surface of the first photoresist pattern 13a is exposed. In other words, only the parts of the Al film 16 located on the parts of the first photoresist pattern 13a are removed, thereby leaving the Al film in the pattern 16a in the openings of the photoresist pattern 13a (FIG. 2(f)). In this process, the Al film pattern 16a left in the openings of the photoresist pattern 13a is slightly etched, but to a negligible extent because the gaps between the parts of the first photoresist pattern 13a and the parts of the second photoresist pattern 17a are very small. Accordingly, the parts of the Al film pattern 16a have a high dimensional accuracy, corresponding exactly to the pattern of the openings in the first photoresist pattern 13a and having a thickness substantially that of the first photoresist pattern 13a.

Finally, the first photoresist pattern 13a and the second photoresist pattern 17a are dissolved by use of a photoresist stripping solution (e.g., a solution sold under the brand name J100), thereby leaving only the desired Al film electrode wirings.

When the method described above is employed, the removal of the parts of the Al film 16 which are not to form parts of the electrode wirings is carried out by the etching controlled by the use of a mask, the etching mask being positioned to cover the desired pattern of Al film formed by the preceding deposition step. Accordingly, only the unnecessary parts of the Al film are readily etched away without significantly disturbing the Al film pattern 16a making up the electrode wirings. This means that the Al film 16, even if it is thick, can readily have the unnecessary parts removed, so that the electrode wirings can be formed with the desired thickness, thereby avoiding wire-disconnection problems and making it possible to obtain yields of integrated circuits.

An application of this invention to the manufacture of an actual semiconductor device will be described.

FIGS. 3a–3d are sectional views showing the steps of forming the electrode wirings in a silicon gate MOS-IC. Referring to Figs., numeral 21 represents a Si substrate, and $SiO_2$ film 22 is formed thereon. There is a notched out part in the $SiO_2$ film 22, and in the Si substrate just under this part, the impurity layer 23 which is to provide the source or drain has been formed. Inside the $SiO_2$ film 22, a first wire 24 formed of a polycrystalline silicon film is provided. The dimensions of edge 25 of the thickness of the $SiO_2$ film 22 and the ledge 26 of the $SiO_2$ film covering the first wiring 24 are 0.5 - 1.0 micron.

Figure 3A:
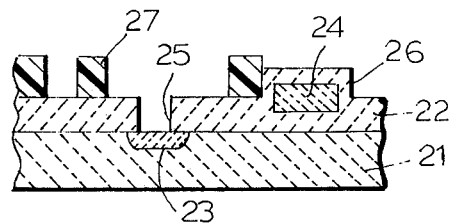
FIGS. 3(a) to 3(d) are sectional views showing the steps in an embodiment in which this invention is applied to the process of forming the electrode wirings in an actual integrated circuit.

On the structure as described above there is first formed the first photoresist pattern 27 as shown in FIG. 3(a). This film is given a thickness of 2.0 microns and is formed of resin sold under the brand name Posiresist AZ 1350J.

Figure 3B:
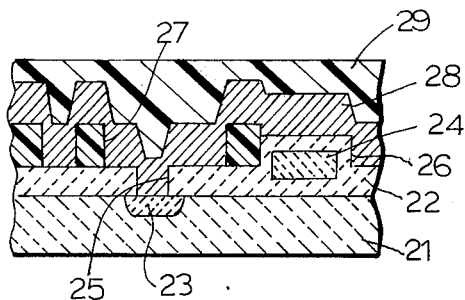

Then, an Al film 28 is vapor-deposited in a thickness greater than that of the risers 25 and 26, and on this film, another photoresist layer 29 is applied (FIG. 3(b).

Figure 3C:
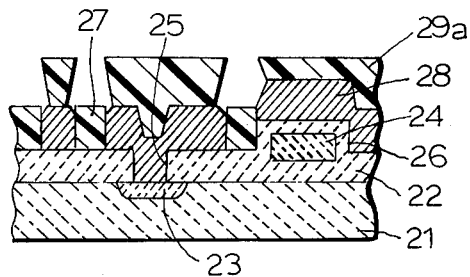
Figure 3D:
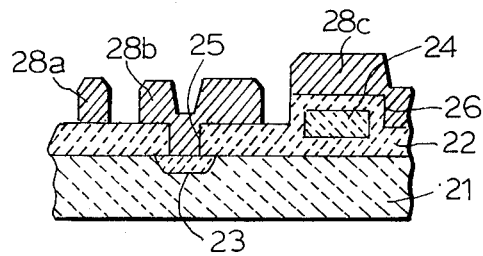

Thereafter, the surface layer of the photoresist layer 29 is removed by oxygen plasma etching until the upper surfaces of the Al film 28 located over the parts of the first photoresist pattern 27 are exposed, this step not being shown in the drawings. In this way, a second photoresist pattern 29a is obtained (as shown in FIG. 3(c)). As is evident, in order that the second photoresist pattern 29a correspond to the required electrode wiring pattern, that is, the inverse of the first photoresist pattern 27, the thickness of the first photoresist pattern must be such that the upper surface thereof is at a higher level than any of the parts of the $SiO_2$ film as seen in FIG. 3(a).

Then, the Al film 28 is etched away with the second photoresist pattern 29a as the etching mask by the use of a phosphoric acid base etching solution, and only the parts of the Al film 28 above the parts of the first photoresist pattern 27 are removed, as shown in FIG. 3(c).

Finally, the first and the second photoresist patterns 27 and 29a are removed by use of a photoresist stripping solution (e.g., a solution sold under the brand name J100. Thereby only the electrode wirings 28a, 28b and 28c are left.

For removing the surface layer part of the photoresist layer 29, ion etching may also be employed.

What is claimed is:

1. A method of forming electrode wirings in semiconductor devices, which comprises the steps of:
    forming a first masking pattern having a configuration inverse to the pattern of the desired electrode wirings on the surface to be provided with such electrode wirings;
    evaporation depositing a conductor onto said masking pattern from above for forming a conductor layer covering both said masking pattern and the nonmasked areas of said surface and having depressions therein over the nonmasked areas of said surface;
    applying a layer of mask-forming material on said conductor layer;
    removing the surface portion of said layer of mask-forming material only to the extent that all the upper surfaces of the parts of said conductor layer above the parts of said first masking pattern are exposed to form a second masking pattern;
    etching said exposed parts of the conductor layer with said second masking pattern as the etching mask to the extent that said first masking pattern is exposed; and removing said first and second masking patterns.

2. A method of forming electrode wirings in semiconductor devices, as claimed in claim 1, wherein said first masking pattern is composed of photoresistive resin of the positive type.

3. A method of forming electrode wirings in semiconductor devices, as claimed in claim 1, wherein said second masking pattern is composed of photoresistive resin.

4. A method of forming electrode wirings in semiconductor devices as claimed in claim 1, wherein said step of removing the surface portions said layer of mask-forming material is performed by oxygen-plasma etching.

5. A method of forming electrode wirings in semiconductor devices, as claimed in claim 1, wherein said first and second masking patterns are composed of the same material.

6. A method of forming electrode wirings in semiconductor devices, as claimed in claim 1, wherein:
    said first masking pattern has a thickness such that the upper surface thereof is at a higher level than any surface on which the electrode wirings are to be formed.

* * * * *